United States Patent
Stahl et al.

(10) Patent No.: US 10,243,559 B2
(45) Date of Patent: Mar. 26, 2019

(54) INTEGRATED CIRCUIT WITH SPARE CELLS

(71) Applicant: NXP USA, Inc., Austin, TX (US)

(72) Inventors: Andreas Stahl, Munich (DE); Hubert Martin Bode, Haar (DE); Ilhan Hatirnaz, Munich (DE)

(73) Assignee: NXP USA, Inc., Austin, TX (US)

( * ) Notice: Subject to any disclaimer, the term of this patent is extended or adjusted under 35 U.S.C. 154(b) by 90 days.

(21) Appl. No.: 15/462,335

(22) Filed: Mar. 17, 2017

(65) Prior Publication Data

US 2017/0331478 A1 Nov. 16, 2017

(30) Foreign Application Priority Data

May 13, 2016 (EP) .................... 16169589

(51) Int. Cl.
*H01L 27/118* (2006.01)
*H03K 19/00* (2006.01)
*H01L 21/3213* (2006.01)
*H01L 21/8238* (2006.01)
*H01L 23/532* (2006.01)
*H01L 27/02* (2006.01)
*H03K 19/003* (2006.01)
*H03K 19/21* (2006.01)
(Continued)

(52) U.S. Cl.
CPC ..... *H03K 19/0013* (2013.01); *H01L 21/3213* (2013.01); *H01L 21/823871* (2013.01); *H01L 23/53271* (2013.01); *H01L 27/0207* (2013.01); *H01L 27/11807* (2013.01); *H03K 19/00315* (2013.01); *H03K 19/00392* (2013.01); *H03K 19/1735* (2013.01); *H03K 19/17764* (2013.01); *H03K 19/215* (2013.01); *H01L 2027/11835* (2013.01); *H01L 2027/11866* (2013.01); *H01L 2027/11875* (2013.01)

(58) Field of Classification Search
CPC ... H01L 21/3213; H01L 27/118; H01L 27/02; H01L 27/0207; H01L 27/11807; H01L 23/532; H01L 23/53271; H01L 2027/11835; H01L 2027/11866; H03K 19/0013; H03K 19/00315; H03K 19/00392; H03K 19/215; H03K 19/1735; H03K 19/17764
USPC ........................................................ 438/128
See application file for complete search history.

(56) References Cited

U.S. PATENT DOCUMENTS 7,458,051 B2 11/2008 Hou et al.
8,810,280 B2 8/2014 Pyapali et al.
9,154,135 B1 10/2015 Jajodia et al.
(Continued)

*Primary Examiner* — Chuong A Luu

(57) ABSTRACT

The disclosure relates to an integrated circuit comprising: a first voltage terminal; a second voltage terminal; and a plurality of logic cells, comprising one or more field effect transistors having a p-type channel and one or more field effect transistors having an n-type channel. The plurality of logic cells comprises a regular subset of cells and a spare subset of cells. Electrical connectors are arranged to: connect the gates of the regular subset of cells in order to provide a functional logic arrangement; connect the gates of the one or more field effect transistors having a p-type channel of the spare subset of cells to the first voltage terminal; and connect the gates of the one or more field effect transistors having an n-type channel of the spare subset of cells to the second voltage terminal.

14 Claims, 4 Drawing Sheets

(51) Int. Cl.
*H03K 19/173* (2006.01)
*H03K 19/177* (2006.01)

(56) References Cited

U.S. PATENT DOCUMENTS

| | | | |
|---|---|---|---|
| 2006/0139063 A1* | 6/2006 | Yano | H02J 7/0016 327/74 |
| 2007/0109832 A1 | 5/2007 | Hou et al. | |
| 2007/0157151 A1 | 7/2007 | Kim | |
| 2008/0029786 A1 | 2/2008 | Fan | |
| 2010/0231256 A1 | 9/2010 | Jain et al. | |
| 2013/0088261 A1 | 4/2013 | Pyapali et al. | |
| 2015/0294944 A1* | 10/2015 | Kuenemund | H03K 3/356104 326/8 |
| 2017/0179134 A1* | 6/2017 | Liaw | H01L 27/1104 |

\* cited by examiner

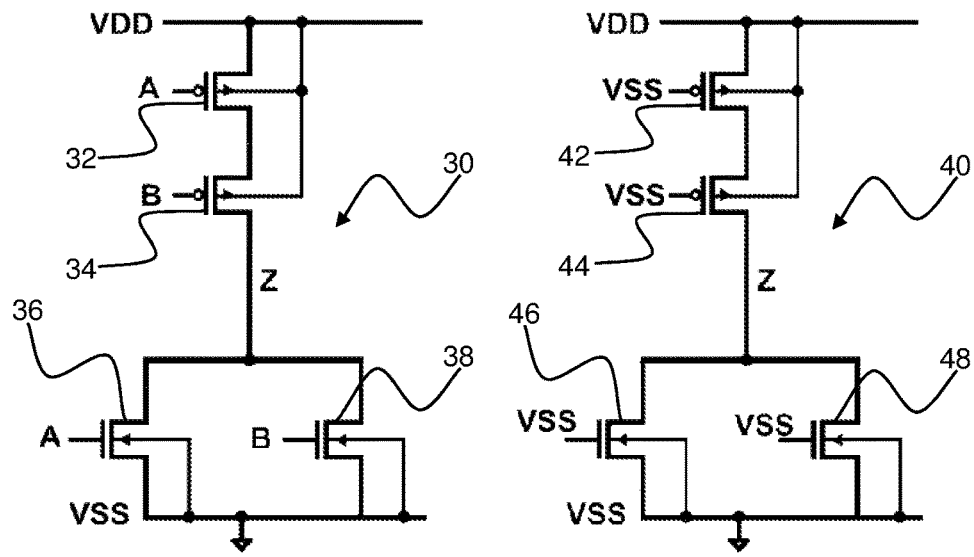
Figure 3
Figure 4
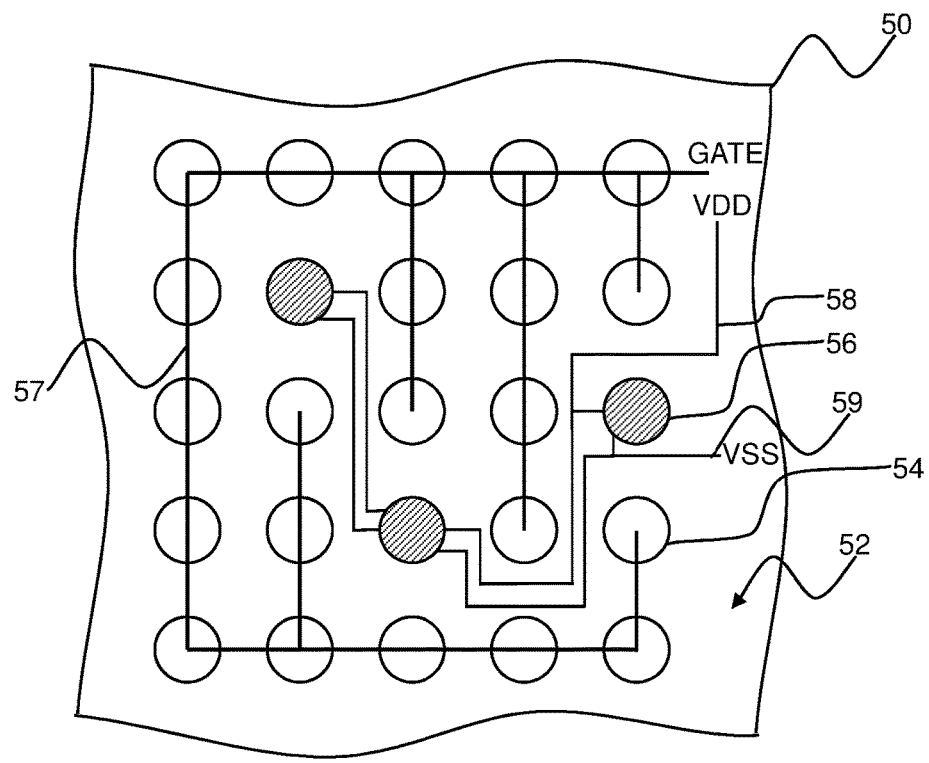
Figure 5

INTEGRATED CIRCUIT WITH SPARE CELLS

FIELD OF THE INVENTION

The present disclosure relates generally to integrated circuits (ICs) with regular and spare cells and in particular, although not exclusively, to reducing power consumption in an IC including spare cells.

BACKGROUND

Traditional cell-based application specific integrated circuit (ASIC) layout designs typically include a set of regular cells that are interconnected to perform the desired function or logic of the ASIC. In particular, ASIC layout designs are common in very large scale integration (VLSI) of complex integrated circuits such as processors. In addition to the base set of functional logic cells, the ASIC layout designs typically comprise a plurality of spare cells that are randomly dispersed throughout the regular cells. The spare cells are included in the ASIC design for the purpose of correcting, altering or changing the functionality of the ASIC during an engineering change order (ECO) process.

There is a demand in the industry to increase the density of regular cells. There is also a demand to increase the density of interspersed spare cells to improve interconnectivity and functionality choices. However, with the ever increasing density of cells, has come an even more dramatic increase in overall power consumption. Typically, each cell, whether a regular cell or spare cell, contributes to the overall power consumption of the ASIC. It is therefore desirable to reduce the power consumption of the ASIC, and in particular the spare cells, in order to improve the overall efficiency of an integrated circuit.

SUMMARY

According to a first aspect of the disclosure there is provided an integrated circuit comprising:
 a first voltage terminal;
 a second voltage terminal, in which the first voltage terminal is configured to receive a positive voltage with respect to the second voltage terminal;
 a plurality of logic cells, each logic cell comprising one or more field effect transistors having a p-type channel and one or more field effect transistors having an n-type channel, in which each transistor has a gate, and in which the plurality of logic cells comprises a regular subset of cells and a spare subset of cells; and
 electrical connectors configured to:
  connect the gates of the regular subset of cells in order to provide a functional logic arrangement;
  connect the gates of the one or more field effect transistors having a p-type channel of the spare subset of cells to the first voltage terminal; and
  connect the gates of the one or more field effect transistors having an n-type channel of the spare subset of cells to the second voltage terminal.

The electrical connectors may comprise metal tracks or conductive tracks. The metal tracks or conductive tracks may be provided in a single layer or in a plurality of layers. Each cell may provide a logic gate. Each of the regular subset of cells may have the same structure as the spare subset of cells. Different cells in the spare subset of cells may provide different respective logic structures.

According to a further aspect of the disclosure there is provided a method of modifying the integrated circuit of any preceding claim, comprising:
 optionally, receiving the integrated circuit;
 disconnecting the gates of the one or more field effect transistors having a p-type channel of at least one of the spare subset of cells from the first voltage terminal;
 disconnecting the gates of the one or more field effect transistors having an n-type channel of the at least one spare subset of cells from the second voltage terminal; and
 connecting the gates of the field effect transistors of the at least one spare subset of cells to the gates of the regular subset of cells in order to provide a modified functional logic arrangement.

Disconnections may be achieved using etching or milling, such as ion beam milling. A metal track or conductive track may be deposited on the substrate in order to connect the gates of the field effect transistors of the at least one spare subset of cells to the gates of the regular subset of cells.

According to a further aspect of the disclosure there is provided a method of manufacturing a method of manufacturing an integrated circuit, comprising:
 forming an integrated circuit substrate comprising:
  a first voltage terminal;
  a second voltage terminal, in which the first voltage terminal is configured to receive a positive voltage with respect to the second voltage terminal;
  a plurality of logic cells, each logic cell comprising one or more field effect transistors having a p-type channel and one or more field effect transistors having an n-type channel, in which each transistor has a gate, and in which the plurality of logic cells comprises a regular subset of cells and a spare subset of cells;
 connecting the regular subset of cells with one or more electrical connectors arranged in order to provide a functional logic arrangement;
 connecting the gates of the one or more field effect transistors having a p-type channel of the spare subset of cells to the first voltage terminal using one more electrical connectors; and
 connecting the gates of the one or more field effect transistors having an n-type channel of the spare subset of cells to the second voltage terminal using one or more electrical connectors.

The one or more electrical connectors may comprise metal tracks or conductive tracks. A semiconductor substrate may comprise the plurality of cells. The method may comprise depositing the metal tracks or conductive tracks on a surface of the substrate. The metal tracks or conductive tracks may be provided in a single layer or a plurality of layers. Each transistor may have a source and a drain. A metal layer may be used to connect the drains of one or more field effect transistors having an n-type channel and the sources of one or more field effect transistors having a p-type channel. The electrical connectors between the spare cells and the voltage terminals may comprise polysilicon wires.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments of the invention will now be described, by way of example only, and with reference to the accompanying figures in which:

FIG. 3 illustrates a circuit diagram for a NOR2 logic gate for use as a regular cell;

FIG. 4 illustrates a circuit diagram for a NOR2 logic gate for use as a spare cell;

FIG. 5 illustrates an integrated circuit with reduced spare cell power consumption;

DETAILED DESCRIPTION OF THE DRAWINGS

Figure 1:
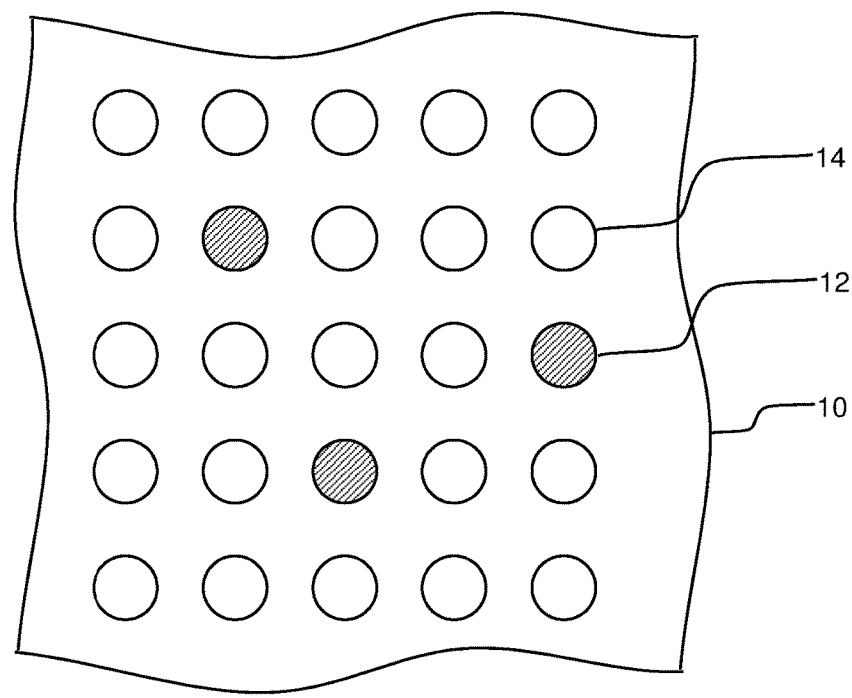
FIG. 1 illustrates a plan view of a cell layout of an integrated circuit with regular cells and spare cells.

FIG. 1 illustrates schematically a plan view of cell layout of a semiconductor substrate of an integrated circuit 10. The integrated circuit 10 comprises a plurality of logic cells 12, 14. The plurality of logic cells comprises a regular subset of cells, or regular cells 14, and a spare subset of cells, or spare cells 12. The regular cells 14 implement an originally desired logic for the integrated circuit 10. Each logic cell 12, 14 comprises one or more field effect transistors (FET—not shown) having a p-type channel and one or more FETs (not shown) having an n-type channel. Each FET has a gate, a source and a drain, and can be provided by a metal oxide semiconductor (MOS) device.

A metallization process is used to deposit conductive tracks on the semiconductor substrate in order to connect the gates and other terminals of the regular cells 14 and provide a desired functional logic arrangement. The metallization process may deposit a metal, such as copper for example, or another conductive material, such as polycrystalline silicon.

After metallization, often certain functional repairs, modifications and/or enhancements are required to be made to the IC to overcome any problems or shortcomings in the function of the IC. A spare cell 12 existing within the IC design may be converted to a "new regular cell" and used to realize the functional repairs, modifications and/or enhancements of the overall functional logic of the IC. Spare cells 12 are selected from within the IC design for conversion and may be converted either before or after the IC has undergone metallization. New connections are made to interconnect between the original regular cells 14 and the new regular cells. Specific spare cells 12 in the IC design are selected and arranged in a particular circuit configuration with metal interconnections during an engineering change order (ECO) process to form part of the working functionality of the IC. The new regular cells 12 are interconnected with the original regular cells 14 in order to achieve the desired functionality during a repair, modification or enhancement of the IC. Not all the spare cells 12 are necessarily selected for interconnection with the regular cells 14 during the ECO. The unconverted spare cells 12 in the IC design are not used to realize the intended logic or working functionality of the IC, but still contribute to the power consumption of the IC.

Figure 2:
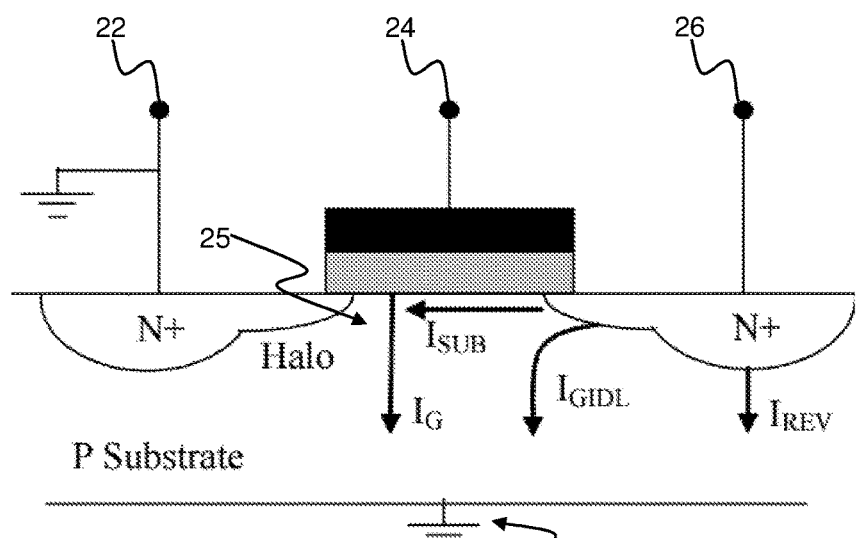
FIG. 2 illustrates a schematic cross-section of a field effect transistor with various current leakage paths.

FIG. 2 illustrates schematically a cross-section of a CMOS field effect transistor with various current losses (a p-channel (NPN) FET is shown in this example). The transistor has a source terminal 22, a gate terminal 24, a drain terminal 26 and a body terminal 28.

There are four main sources of leakage current for the CMOS FET:
1. reverse-biased junction leakage current ($I_{REV}$) between the drain terminal 26 and the body terminal 28;
2. gate-induced drain leakage ($I_{GIDL}$) between the drain terminal 26 and the body terminal 28 in the gate region 25;
3. gate direct-tunneling leakage ($I_G$) between the gate terminal 24 and the body terminal 28; and
4. subthreshold (weak-inversion) leakage ($I_{SUB}$) between the drain terminal 26 and the source terminal 22 in the gate region 25.

Although it is preferable from a design flexibility perspective to place more spare cells in an IC in order to enable metal-only changes and avoid changes in front-end layers when performing ECOs, the provision of additional spare cells occupies more area and increases leakage current. Further, cells with relatively rapid switching times (e.g. standard voltage threshold (SVT-based) switching) can be suitable for the provision of spare cells because the final timing requirements of the spare cells when implemented in functional logic are unknown at the time of first manufacture. However, such cells tend to have relatively high power consumption and so exacerbate the problems associated with power loss due to spare cell provision and leads to an above-average contribution of the spare cells to the leakage current in a CMOS gate area.

Spare cells may comprise a collection of different cells having different functions. Each spare cell typically includes at least one transistor and is pre-configured for a particular logic function. For example, each spare cell may comprise at least one logic gate such as an inverter, NAND, NOR, flip-flop, and the like using PMOS or NMOS designs.

FIGS. 3 and 4 illustrate circuit diagrams for example logic gates of a regular cell 30 and a spare cell 40, respectively, for use as cells in an integrated circuit such as the circuit described previously with reference to FIG. 1. The regular cell 30 and the spare cell 40 in this example each provide a NOR2 logic gate structure.

The NOR2 logic gate comprises a positive voltage terminal, a negative voltage or ground terminal and a plurality of field effect transistors (FETs) arranged to provide the NOR2 logic. In general, the positive voltage terminal may be referred to as a first voltage terminal VDD and the negative voltage or ground terminal may be referred to as a second voltage terminal VSS. The plurality of FETs includes a first p-channel FET 32; 42, a second p-channel FET 34; 44, a first n-channel FET 36; 46 and a second n-channel FET 38; 48. Each FET 32; 42, 34; 44, 36; 46, 38; 48 has a gate terminal, a source terminal, a drain terminal and a body terminal.

The body terminals of the first and second p-channel FETs 32; 42, 34; 44 are connected to the first voltage terminal VDD. The body terminals of the first and second n-channel FETs 36; 46, 38; 48 are connected to the second voltage terminal VSS.

The source terminal of the first p-channel FET 32; 42 is connected to the first voltage terminal VDD. The drain terminal of the first p-channel FET 32; 42 is connected to the source terminal of the second p-channel FET 34; 44. The drain terminal of the second p-channel FET 34; 44 is connected to the drain terminals of the first and second n-channel FETs 36; 46, 38; 48. The source terminals of the first and second n-channel FETs 36; 46, 38; 48 are connected to VSS.

In the regular cell arrangement illustrated in FIG. 3, the gate of the first p-channel FET 32 is connected to the gate of the first n-channel FET 36 in order to receive a first logic input A. The gate of the second p-channel FET 34 is connected to the gate of the second n-channel FET 36 in order to receive a second logic input B.

In the spare cell arrangement illustrated in FIG. 4, the gates of all of the FETs 42, 44, 46, 48 are connected to the second voltage terminal VSS. In all of the selected and unselected spare cells, the terminals of the PMOS and NMOS transistors are always connected to VDD and VSS. This results in current leakage through VDD, VSS and the gates and adds to dissipated leakage power.

In this way each cell of the IC, whether it is an original regular cell, unconverted spare cell or new regular cell, is connected to ground and power. Every spare cell, even the unconverted spare cells that remain unconnected to the regular cells and do not become part of the working functionality of the IC, are connected to ground and power before and after the metallization process, and therefore contribute to the overall power consumption of the IC. It is therefore desirable to minimize or reduce power consumption whilst maintaining the design flexibility enabled by the provision of spare cells.

FIG. 5 illustrates an example embodiment of an integrated circuit 50 with reduced spare cell power consumption.

The integrated circuit 50 has a first voltage terminal VDD and a second voltage terminal VSS. The first voltage terminal VDD is configured to receive a positive voltage with respect to the second voltage terminal VSS. That is, the first voltage terminal VDD may be considered to be a positive voltage terminal and the second voltage terminal VSS may be considered to be a negative, or ground voltage terminal.

As in the example described with reference to FIG. 1, the integrated circuit 50 comprises a plurality of logic cells 52. Each logic cell 52 comprises one or more field effect transistors (FETs—not shown) having a p-type channel and one or more FETs (not shown) having an n-type channel. Each FET has at least a gate terminal, a source terminal and a drain terminal, and may be provided by as a metal oxide semiconductor (MOS) device. The plurality of logic cells 52 comprises a regular subset of cells, or regular cells 54, and a spare subset of cells, or spare cells 56. The regular cells 54 implement an originally desired logic for the integrated circuit 50 and the spare cells provide functional flexibility for executing engineering change orders (ECO).

A first set of electrical connectors 57 connects the gates of the regular subset of cells in order to provide a functional logic arrangement.

A second set of electrical connectors 58 connects the gates of the one or more field effect transistors having a p-type channel of the spare cells 56 to the positive voltage terminal VDD. A second set of electrical connectors 59 connects the gates of the field effect transistors having an n-type channel of the spare cells 56 to the negative voltage terminal VSS. In this configuration, all of the transistors in the spare cells 56 are turned off, which results in the output of the transistors in the spare cells 56 being at a high-impedance state. Gate leakage and subthreshold leakage are reduced significantly and so the arrangement of the integrated circuit 50 results in an overall reduction in leakage current compared to the example in FIG. 4. However, the arrangement of the integrated circuit 50 maintains the core advantages of the provision of spare cell in that the functional layout of the integrated circuit 50 may be changed by amending an overlying metallization layer in order to implement an engineering change order, without the need to modify the substrate of the integrated circuit 50.

A specific implementation of spare and regular cells in accordance with the example of FIG. 5 is described below with regard to FIGS. 6 to 9 for a NOR2 structure.

Figure 6:
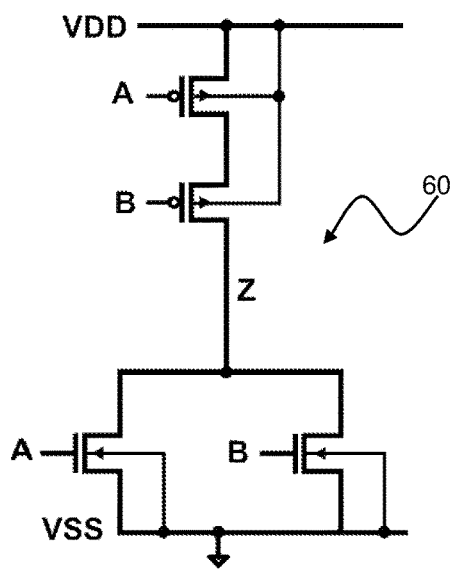
FIG. 6 illustrates a circuit diagram for a NOR2 logic gate for use as a regular cell in an integrated circuit.
Figure 7:
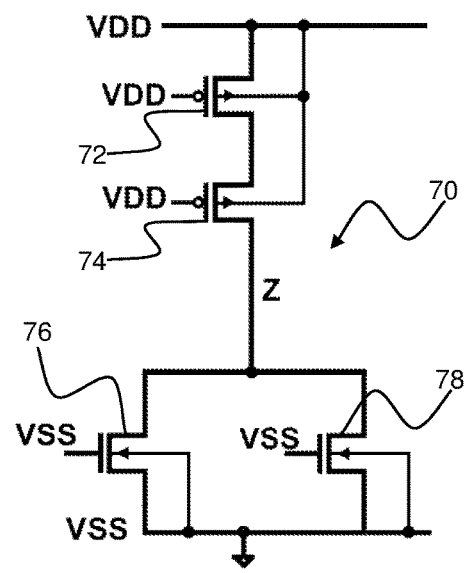
FIG. 7 illustrates a circuit diagram for a NOR2 logic gate for use as a spare cell in an integrated circuit.

FIGS. 6 and 7 illustrate a circuit diagram for a NOR2 logic gate for use as a regular cell 60 and a spare cell 70, respectively, in an integrated circuit such as that described with reference to FIG. 5.

The arrangement of the regular cell 60 is the same as that described previously with reference to the regular cell of FIG. 3.

The spare cell 70 of FIG. 7 has similarities with the arrangement of the spare cell previously described with reference to FIG. 4 in that the plurality of FETs includes a first p-channel FET 72, a second p-channel FET 74, a first n-channel FET 76 and a second n-channel FET 78. Each FET 72, 74, 76, 78 has a gate terminal, a source terminal, a drain terminal and a body terminal. The spare cell 70 differs from the spare cell described previously with reference to FIG. 4 in that the gates of the first and second p-channel FETs 72, 74 are connected to the first voltage terminal VDD instead of the second voltage terminal VSS. The spare cell 70 differs from the regular cell illustrated in FIG. 6 in that inputs (gates) to the PMOS transistors 72, 74 and NMOS transistors 76, 78 are tied to the first voltage terminal VDD and the second voltage terminal VSS, respectively. The common inputs to the P- and N-devices are separated in the spare cell 70 because the PMOS inputs (gates) are tied to VDD and the NMOS inputs (gates) are tied to VSS. In this configuration, all of the transistors 72, 74, 76, 78 are turned off, which results in the output of the transistors 72, 74, 76, 78 being at a high-impedance state.

The arrangement of the spare cell 70 has an advantageous effect on the power consumption of the spare cell 70 compared to the spare cell described previously with reference to FIG. 4. For example, the gate-to-well voltage of the spare cell 70 is 0V, which results in gate leakage (gate direct-tunneling leakage ($I_G$) as discussed with reference to FIG. 2) being reduced significantly. Also, the drain-to-source voltage is reduced and so the subthreshold leakage ($I_{SUB}$) is also reduced significantly. A comparison of total cell leakage current between the 'original' spare cell described with reference to FIG. 4 and the 'proposed' spare cell 70 is shown in the table overleaf.

|  | Temp. [° C.] | Leakage [pA] | | |
|---|---|---|---|---|
|  |  | Original spare cell 40 | Proposed spare cell 70 | Ratio |
| Typical | 25 | ~380 | ~5 | ~100 |
|  | 150 | ~18000 | ~770 | ~25 |

-continued

| | Temp. [° C.] | Leakage [pA] | | |
| | | Original spare cell 40 | Proposed spare cell 70 | Ratio |
|---|---|---|---|---|
| Best case | 25 | ~2000 | ~10 | ~250 |
| | 150 | ~60000 | ~1400 | ~40 |

Figure 8:
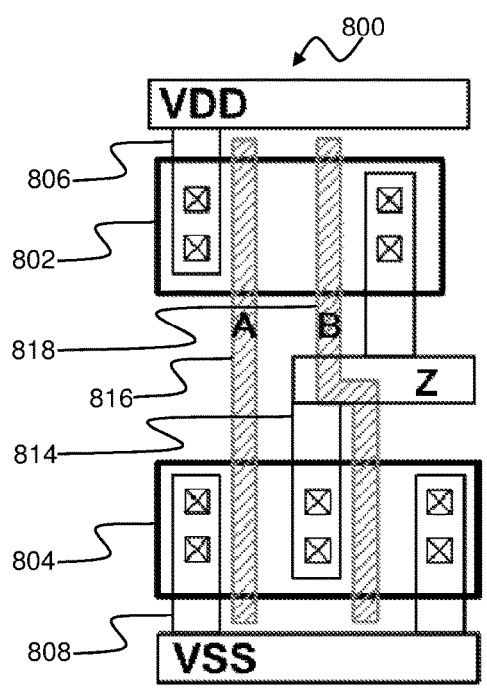
FIG. 8 illustrates a schematic plan view of an example circuit layout for the logic gate of FIG. 6.

FIG. 8 illustrates schematically a plan view of an example circuit layout for a logic gate 800 of a standard cell described previously with reference to FIG. 6. In this example, the logic gate 800 provides a NOR2 logic arrangement.

The logic gate 800 comprises a substrate with a first active area 802 and a second active area 804. The first active area 802 comprises first and second PMOS FETs and the second active area 804 comprises first and second NMOS FETs, as described previously with reference to FIG. 6.

A first conductive layer is provided on the substrate. The first conductive layer provides a first voltage terminal VDD and a second voltage terminal VSS. A first metallic connection 806 is provided between the first voltage terminal VDD and the first active area 802 in order to connect a drain of a first p-FET (not shown) in the first active area 802 to the first voltage terminal VDD. A second metallic connection 808 is also provided between the second voltage terminal VSS and the second active area 804 in order to connect sources of n-FETs (not shown) in the second active area 804 to the second voltage terminal VSS. The first conductive layer further comprises a third metallic connection (Z) 814 between the first and second active areas 802, 804. The third metallic connection (Z) 814 provides an electrical connection between a source of a second p-FET (not shown) in the first active area 802 and drains of the first and second n-FETs in the second active area 804.

A second conductive layer is also provided. The second conductive layer comprises a fourth metallic connection 816 and a fifth conductive connection 818. Each of the fourth and fifth conductive connections 816, 818 provides an electrical connection between the first active area 802 and the second active area 804. The gate of the first p-channel FET in the first active area 802 is connected by the fourth conductive connection 816 to the gate of the first n-channel FET in the second active area 804 in order to receive a first logic input A. The gate of the second p-channel FET in the first active area 802 is connected by the fourth conductive connection 816 to the gate of the second n-channel FET 26 in the second active area 804 in order to receive a second logic input B.

The first conductive layer may be electrically insulated from the second conductive layer. Specifically, the fifth conductive layer 818 is not in direct electrical contact with the third conductive layer 814 at the points where one layer overlies the other, as shown in FIG. 8.

The first conductive layer may be provided by a first type of material and the second conductive layer may be provided by a second type of material (in which the first type of material is a different type of material to the second type of material). Polycrystalline silicon may be deposited in trenches at the surface of the substrate or on the substrate. Metal layers may be formed on the substrate. For example, the first type of material may be a metal, such as copper, and the second type of material may be a semiconductor layer, such as a deposited layer of polycrystalline silicon. In some modern fabrication technologies, NMOS and PMOS gates cannot be readily directly connected using a poly silicon via, or wire, and so in such cases it may be necessary to connect such gates using a metal layer. In one alternative example, the first conductive layer and the second conductive layer may be provided by a single layer of a single material.

Figure 9:
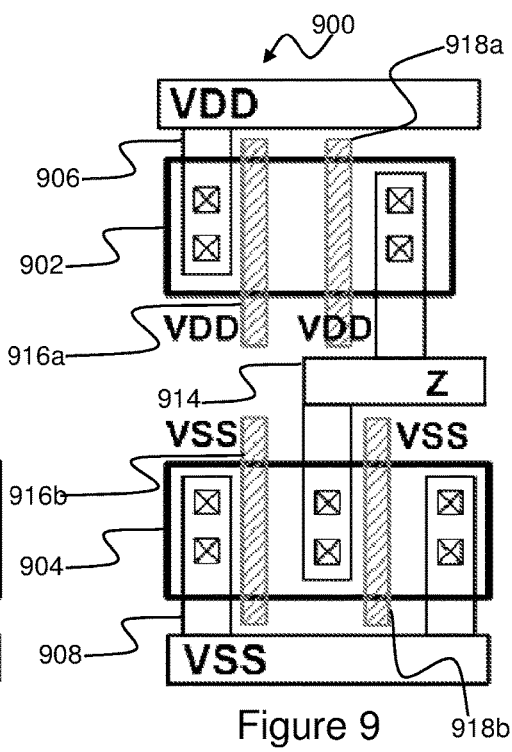
FIG. 9 illustrates a schematic plan view of an example circuit layout for the logic gate of FIG. 7.

FIG. 9 illustrates a schematic plan view of an example circuit layout for a logic gate 900 of the spare cell described previously with reference to FIG. 7.

Corresponding reference numerals are used between FIGS. 8 and 9 to refer to similar components. The logic gate 900 is similar to that described with reference to FIG. 8 in that the arrangement of the first and second active areas 902, 904 and the first conductive layer 906, 908, 914 is the same as that described with reference to the standard cell in FIG. 8. Also as in the standard cell of FIG. 8, the second conductive layer of the spare cell in FIG. 9 may be provided by a plurality of poly silicon connections, also referred to as poly wires. However, the arrangement of the second conductive layer of the logic gate 900 of the spare cell differs from that of the standard cell described previously with reference to FIG. 8. This difference in the arrangement of the second conductive layer may be achieved by modifying a single layer or mask.

In comparison to the standard cell, the fourth conductive connection and the fifth conductive connection of the spare cell are each separated into a first subpart 916a, 918a and a second subpart 916b, 918b. The first subparts 916a, 918a of the fourth and fifth conductive connections each provide a connection between the gates of the transistors in the first active region 902 and the first voltage terminal VDD. The first subparts 916b, 918b of the fourth and fifth conductive connections each provide a connection between the gates of the transistors in the second active region 904 and the second voltage terminal VSS. For clarity, the connection between the conductive connections and the first and second voltage terminals VDD, VSS, which are typically provided by metal lines, are not shown in FIG. 9. In this way, the proposed spare cell separates segments driving the NMOS transistors from segments driving the PMOS transistors for every poly wire. In addition the PMOS-driving poly wire segments are tied to VDD and the NMOS-driving poly wire segments are tied to VSS.

Figure 10:
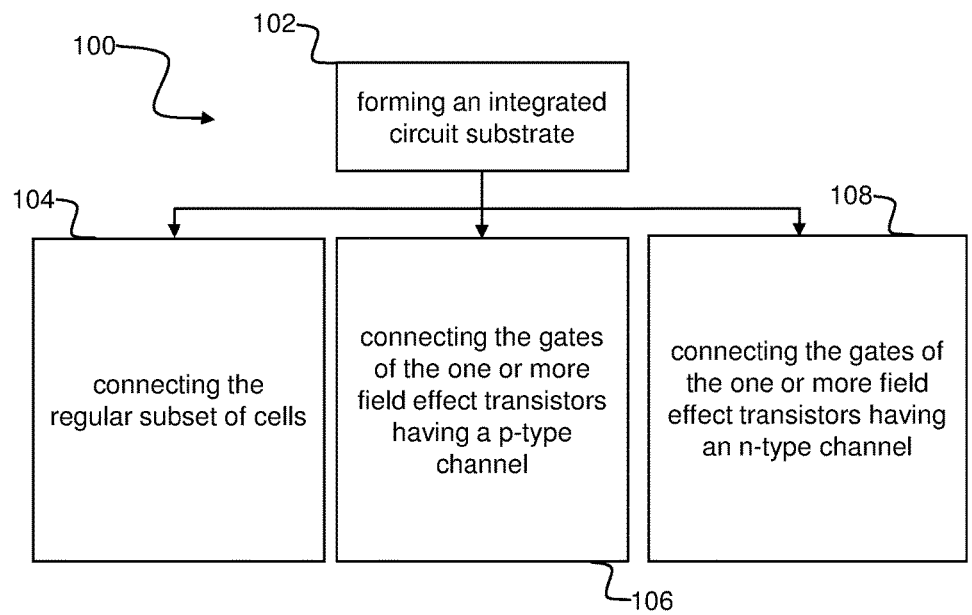
FIG. 10 illustrates a method for manufacturing an integrated circuit.

FIG. 10 illustrates a method 100 for manufacturing an integrated circuit such as that described with reference to FIG. 5.

The method 100 comprises forming 102 an integrated circuit substrate. The integrated circuit substrate comprises a first voltage terminal (VDD), a second voltage terminal (VSS) and a plurality of logic cells. The first voltage terminal is configured to receive a positive voltage with respect to the second voltage terminal. Each logic cell comprises one or more field effect transistors having a p-type channel and one or more field effect transistors having an n-type channel. Each transistor may have a gate, a source, a drain and a body terminal. The plurality of logic cells comprises a regular subset of cells and a spare subset of cells.

The order of completion of three subsequent steps of the method 100 may be varied. The subsequent steps include:
connecting 104 the regular subset of cells with one or more electrical connectors arranged in order to provide a functional logic arrangement;
connecting 106 the gates of the one or more field effect transistors having a p-type channel of the spare subset of cells to the first voltage terminal using one more electrical connectors; and connecting 108 the gates of the one or more field effect transistors having an n-type channel of the spare subset of cells to the second voltage terminal using one or more electrical connectors.

Disconnections may be achieved using etching or milling, such as ion beam milling, for example. A metal track or conductive track may be deposited on the substrate in order to connect the gates of the field effect transistors of the at least one spare subset of cells to the gates of the regular subset of cells.

Figure 11:
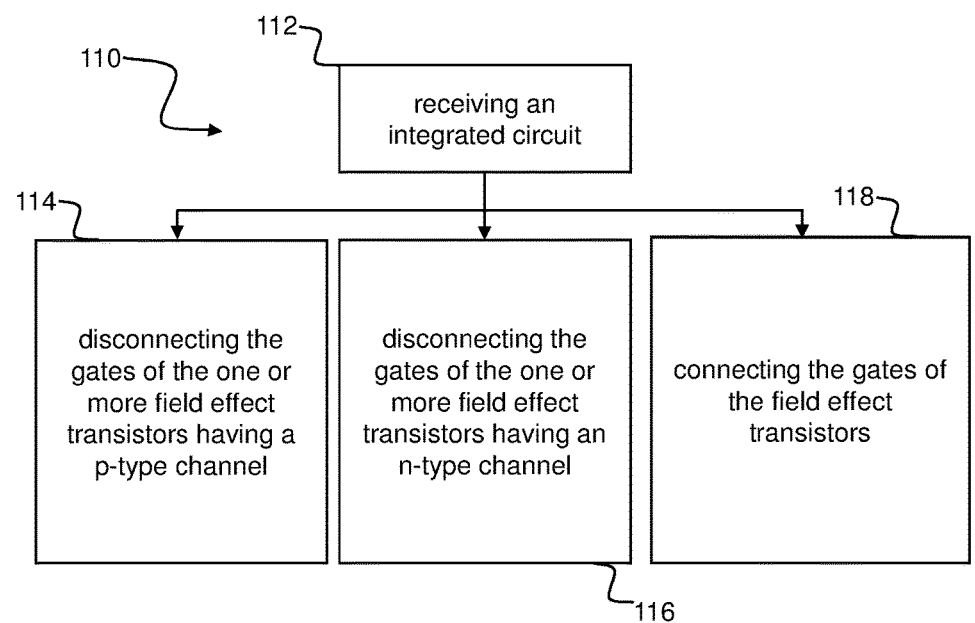
FIG. 11 illustrates a method for modifying an integrated circuit.

FIG. 11 illustrates a method 110 for modifying an integrated circuit such as that described with reference to FIG. 5, or such as that manufactured by the method described with reference to FIG. 10.

The method 110 comprises an optional step of initially receiving 112 an integrated circuit (IC). The integrated circuit comprises a substrate having a first voltage terminal, a second voltage terminal and a plurality of logic cells. The first voltage terminal is configured to receive a positive voltage with respect to the second voltage terminal. Each logic cell comprises one or more field effect transistors having a p-type channel and one or more field effect transistors having an n-type channel. Each transistor may have a gate, a source, a drain and a body terminal. The plurality of logic cells comprises a regular subset of cells and a spare subset of cells.

The order of completion of three subsequent steps of the method 110 may be varied. The subsequent steps include:
disconnecting 114, from the first voltage terminal, the gates of the one or more field effect transistors having a p-type channel of at least one of the spare cells;
disconnecting 116, from the second voltage terminal, the gates of the one or more field effect transistors having an n-type channel of the at least one spare cell; and
connecting 118 the gates of the field effect transistors of the at least one spare cell to the gates of the regular subset of cells in order to provide a modified functional logic arrangement.

The electrical connectors may comprise metal tracks or conductive tracks. The metal tracks or conductive tracks may be provided in a single layer or in a plurality of layers as described with reference to FIG. 9.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums.

Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

What is claimed is:

1. An integrated circuit comprising:
a first voltage terminal;
a second voltage terminal, in which the first voltage terminal is configured to receive a positive voltage with respect to the second voltage terminal;
a plurality of logic cells, each logic cell comprising one or more field effect transistors having a p-type channel and one or more field effect transistors having an n-type channel, in which each transistor has a gate, and in which the plurality of logic cells comprises a regular subset of cells and a spare subset of cells; and
electrical connectors configured to:
connect the gates of the regular subset of cells in order to provide a functional logic arrangement;
connect the gates of the one or more field effect transistors having a p-type channel of the spare subset of cells to the first voltage terminal;
connect the gates of the one or more field effect transistors having an n-type channel of the spare subset of cells to the second voltage terminal;
disconnect the gates of the one or more field effect transistors having a p-type channel of the spare subset of cells from the first voltage terminal;
disconnect the gates of the one or more field effect transistors having an n-type channel of the spare subset of cells from the second voltage terminal; and
connect the gates of the field effect transistors of the spare subset of cells to the gates of the regular subset of cells in order to provide a modified functional logic arrangement.

2. The integrated circuit of claim 1 wherein the electrical connectors comprise metal tracks or conductive tracks.

3. The integrated circuit of claim 2 wherein the metal tracks or conductive tracks are provided in a single layer.

4. The integrated circuit of claim 1 wherein each cell provides a logic gate.

5. The integrated circuit claim 1 wherein each of the regular subset of cells has the same structure as the spare subset of cells.

6. The integrated circuit of claim 1 wherein different cells in the spare subset of cells provide different respective logic structures.

7. The integrated circuit of claim 1 wherein disconnections are achieved using etching or milling.

8. The integrated circuit of claim 1 further comprising a metal track or conductive track deposited on the substrate in order to connect the gates of the field effect transistors of the spare subset of cells to the gates of the regular subset of cells.

9. An integrated circuit, comprising:
a plurality of logic cells, each logic cell comprising one or more field effect transistors having a p-type channel and one or more field effect transistors having an n-type channel, in which each transistor has a gate, and in which the plurality of logic cells comprises a regular subset of cells and a spare subset of cells;
in a first functional configuration:
the regular subset of cells are connected with one or more electrical connectors;
the gates of the one or more field effect transistors having a p-type channel of the spare subset of cells are connected to a first voltage terminal using one or more electrical connectors; and
the gates of the one or more field effect transistors having an n-type channel of the spare subset of cells are connected to a second voltage terminal using one or more electrical connectors;
in a modified functional logic arrangement:
the gates of the one or more field effect transistors having a p-type channel of the spare subset of cells are disconnected from the first voltage terminal;
the gates of the one or more field effect transistors having an n-type channel of the spare subset of cells are disconnected from the second voltage terminal; and
the gates of the field effect transistors of the spare subset of cells are connected to the gates of the regular subset of cells using one or more electrical connectors.

10. The integrated circuit of claim 9 wherein the one or more electrical connectors comprise metal tracks or conductive tracks.

11. The integrated circuit of claim 10 wherein a semiconductor substrate comprises the plurality of cells, the metal tracks or conductive tracks are on a surface of the substrate.

12. The integrated circuit of claim 10 wherein the metal tracks or conductive tracks are provided in a single layer.

13. The integrated circuit of claim 9 wherein each transistor has a source and a drain, comprising connecting, using a metal layer, the drains of one or more field effect transistors having an n-type channel and the sources of one or more field effect transistors having a p-type channel.

14. The integrated circuit of claim 9 wherein the electrical connectors between the spare cells and the voltage terminals comprise polysilicon wires.

* * * * *